(12) United States Patent
Hart

(10) Patent No.: US 7,821,359 B2
(45) Date of Patent: Oct. 26, 2010

(54) BAND-STOP FILTERS

(75) Inventor: Thomas Richard Hart, Canastota, NY (US)

(73) Assignee: John Messalingua Associates, Inc., East Syracuse, NY (US)

( * ) Notice: Subject to any disclaimer, the term of this patent is extended or adjusted under 35 U.S.C. 154(b) by 34 days.

(21) Appl. No.: 11/775,000

(22) Filed: Jul. 9, 2007

(65) Prior Publication Data

US 2009/0015350 A1    Jan. 15, 2009

(51) Int. Cl.
   *H03H 7/01*     (2006.01)
   *H03H 7/12*     (2006.01)
(52) U.S. Cl. .................................. 333/176; 333/185
(58) Field of Classification Search ............... 333/176, 333/175, 185, 168
   See application file for complete search history.

(56) References Cited

U.S. PATENT DOCUMENTS

| | | | |
|---|---|---|---|
| 5,864,460 A * | 1/1999 | Fan ............................. | 361/328 |
| 6,094,211 A | 7/2000 | Baran et al. | |
| 6,385,030 B1 | 5/2002 | Beene | |
| 6,737,935 B1 | 5/2004 | Shafer | |
| 6,784,760 B2 | 8/2004 | Olcen et al. | |
| 6,842,086 B1 | 1/2005 | Zennamo, Jr. | |
| 6,894,585 B2 | 5/2005 | Keeney et al. | |
| 2004/0055021 A1 | 3/2004 | Marland | |
| 2004/0201783 A1 | 10/2004 | Yamamoto | |
| 2005/0219010 A1 | 10/2005 | Erb | |
| 2005/0283815 A1 | 12/2005 | Brooks et al. | |
| 2006/0038635 A1 * | 2/2006 | Richiuso et al. ............. | 333/177 |
| 2006/0141978 A1 * | 6/2006 | Liu ............................. | 455/333 |
| 2008/0161886 A1 * | 7/2008 | Stevenson et al. ............. | 607/60 |

* cited by examiner

Primary Examiner—Benny Lee
Assistant Examiner—Gerald Stevens
(74) Attorney, Agent, or Firm—Alston & Bird LLP

(57) ABSTRACT

Multiple tank elements disposed along a common axis and multiple conductive pads disposed along opposing sides of the tank elements define a serpentine transmission path. The tank elements, each having a capacitor and an inductor in parallel communication, define respective portions of the serpentine transmission path that cross the common axis. In a circuit element having multiple tank elements defining a transmission path in which each tank element is preceded or followed by a next neighbor tank element, inductors of next neighbor tank elements are structured to generate directionally opposing magnetic fields upon passage of electrical current progressing along the transmission path.

20 Claims, 4 Drawing Sheets

BAND-STOP FILTERS

BACKGROUND OF THE INVENTION

These descriptions relate generally to circuit elements that attenuate oscillating electrical signals in predetermined frequency ranges, and more particularly to band-stop filters useful, for example, in cable-television networks and other applications where multi-frequency signals are transmitted and predetermined ones of the signals are to be blocked.

In a typical cable television (CATV) network, a head-end facility generally broadcasts a variety of programs in a number of respective frequency channels. At the user end of the network, users selectively tune their television units and other media devices to particular frequency channels to receive particular programs. In many such networks, particular ranges of channels are dedicated to particular subscription contracts or tentative pay-per-view arrangements. For example, premium programming selections, for which extra payments are required, may be exclusively provided on dedicated ranges of frequency channels. Accordingly, users can optionally decline to view particular ranges of channels. Operators of such a network are thus challenged to block declined programs from being viewed by particular users. Without such enforcement, many users would likely view premium programming while declining to pay the associated fees. Accordingly, many band-stop filters are available for blocking selected channels ranges and permitting channels ranges above and below the selected ranges.

The advent of digital programming in CATV networks has given rise to challenges in blocking selected frequency ranges while permitting passage of signals in frequencies near the blocked ranges. Reduced insertion loss and increased return loss are desired in frequencies to be passed. Insertion loss refers to energy losses as a signal traverses a circuit. Return loss refers to the attenuation of signal reflections, which propagate back toward the source of a signal, as a signal traverses a receiving circuit. Improved attenuation is desired in any frequency range selected to be blocked. Currently available filters used in the CATV industry exhibit insertion-loss and return-loss performances that are unacceptable in some applications. It is believed that parasitic circuit effects and inductive couplings, such as magnetic field couplings, among filter components contribute to the failures of the available filters. Thus, improved band-stop filters are needed at least to meet the current challenges in the CATV industry.

Therefore, filters having improved insertion-loss and return-loss performances in CATV frequency ranges are desired. Accordingly, improvements in circuit elements and arrangements thereof are needed toward minimizing or at least reducing the mutual couplings among the components of band-stop filters.

BRIEF SUMMARY OF THE INVENTION

The present invention addresses the above needs and enables other advantages by providing circuit elements exhibiting low insertion loss and high reflection loss in both low-frequency and high-frequency pass bands, and exhibiting high attenuations in intermediate-frequency stop bands. According to at least one aspect of the invention, a circuit element comprises a first tank element and a second tank element in series electrical communication with the first tank element. Each of the tank elements includes a capacitor and an inductor coil in parallel electrical communication with the capacitor. The inductor coils of the two tank elements are disposed about a common axis with at least one capacitor disposed on the common axis between the inductor coils.

In a particular embodiment according to this aspect, the tank elements define a transmission path in which the first tank element is followed by the second tank element. In that embodiment, the inductor coils of the tank elements are structured to generate respective magnetic fields directionally opposing each other when electrical currents progress along the transmission path by flowing through the inductor coils. Other elements, such as a shunt element, may be included in that embodiment. For example, a shunt element may be in electrical communication with at least one of the tank elements. The shunt element may include an inductor structured to generate a magnetic field perpendicular to the magnetic fields generated by the inductor coils of the tank elements.

According to an additional aspect of the invention, a circuit element comprises multiple tank elements disposed along a common axis with each tank element preceded by or following at least one other next neighbor tank element. Each of these tank elements includes a capacitor and an inductor in parallel electrical communication with each other. The inductors are all disposed along a common axis. Electrically conductive first pads are disposed along a first side of the tank elements, each connecting two next neighbor tank elements into series electrical communication with each other. At least one conductive second pad is disposed along a second side of the tank elements, the second side being opposite the first side. The second pad connects two next neighbor tank elements into series electrical communication with each other. A serpentine transmission path is defined. Each of the tank elements defines a respective portion of the serpentine transmission path, each portion crossing the common axis.

In at least one embodiment according to this additional aspect, the two tank elements connected by the second pad have respective inductors structured to generate respective magnetic fields that oppose each other when respective currents flow to and from the second pad through the respective inductors. Also, in at least one embodiment, at least one capacitor is disposed on the common axis between the inductors of each pair of next neighbor tank elements. In a particular embodiment, the circuit element also comprises a circuit board having front and back opposing faces. In that embodiment, conductive pads are disposed on the front and back faces in one-to-one correspondence, with corresponding pads disposed opposing each other and defining substantially identical respective footprints parallel to the circuit board. Corresponding pads may connect the same next neighbor tank elements into series electrical communication. Furthermore, in at least one embodiment, the circuit element includes contacts and grounding elements that are interrupted from together completely surrounding the conductive first and second pads in a common plane by spark gaps defined by the grounding elements.

According to a further aspect of the invention, a circuit element comprises multiple tank elements disposed along a common axis in series electrical communication with each other. The multiple tank elements define a transmission path in which each tank element is preceded by or followed by at least one other next neighbor tank element. Each tank element comprises a capacitor and an inductor in parallel electrical communication with the capacitor. Each inductor is disposed along the common axis and is structured to generate an internal magnetic field parallel to the common axis upon passage of electrical current progressing along the transmission path through the inductor. The magnetic field so generated by the inductor of each particular tank element directionally opposes the magnetic field so generated by the inductor of each other tank element next neighbor to the particular tank element.

In at least one embodiment according to this further aspect, the circuit element also includes multiple shunt elements, each of which is in electrical communication with at least one of the tank elements. Each shunt element includes an inductor structured to generate an internal magnetic field that is perpendicular to the common axis upon passage of electrical current through the shunt element. Also, in at least one embodiment, the circuit element includes multiple shunt elements and a planar circuit board upon which the tank elements are mounted. These shunt elements each include an inductor structured to generate an internal magnetic field that passes through the circuit board upon passage of electrical current through the shunt element.

BRIEF DESCRIPTIONS OF THE DRAWINGS

Having thus described the invention in general terms, reference will now be made to the accompanying drawings, which are not necessarily drawn to scale, and wherein:

Figure 2:
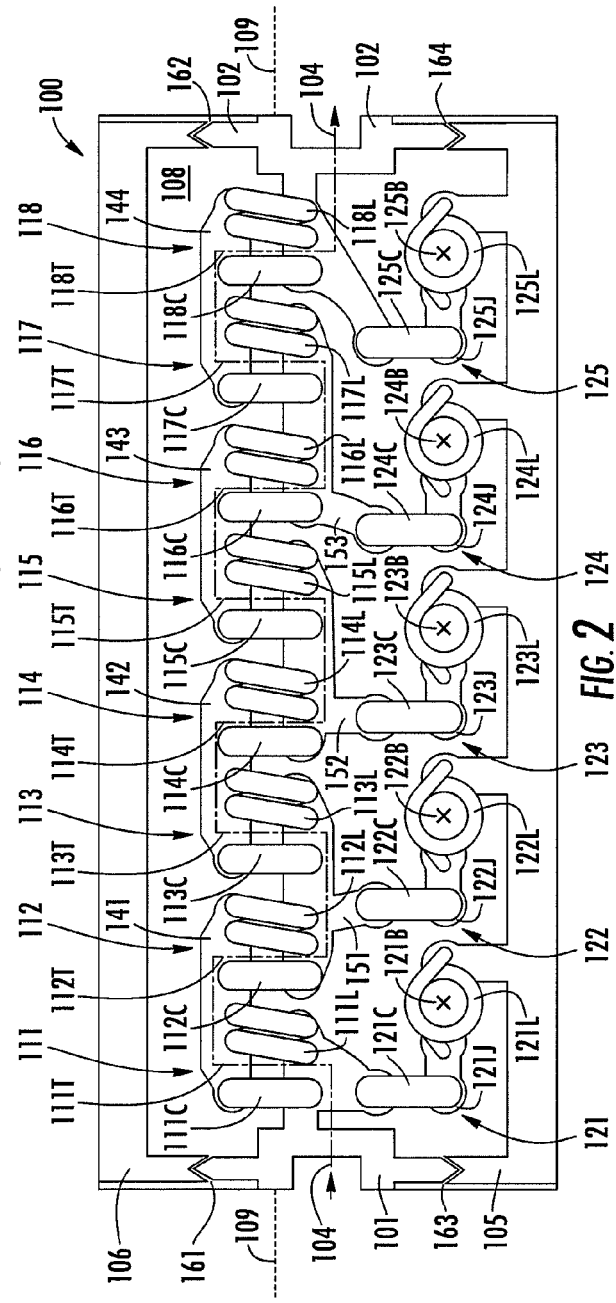
FIG. 2 is a plan view of a circuit element in accordance with at least one embodiment of the invention.
Figure 4:
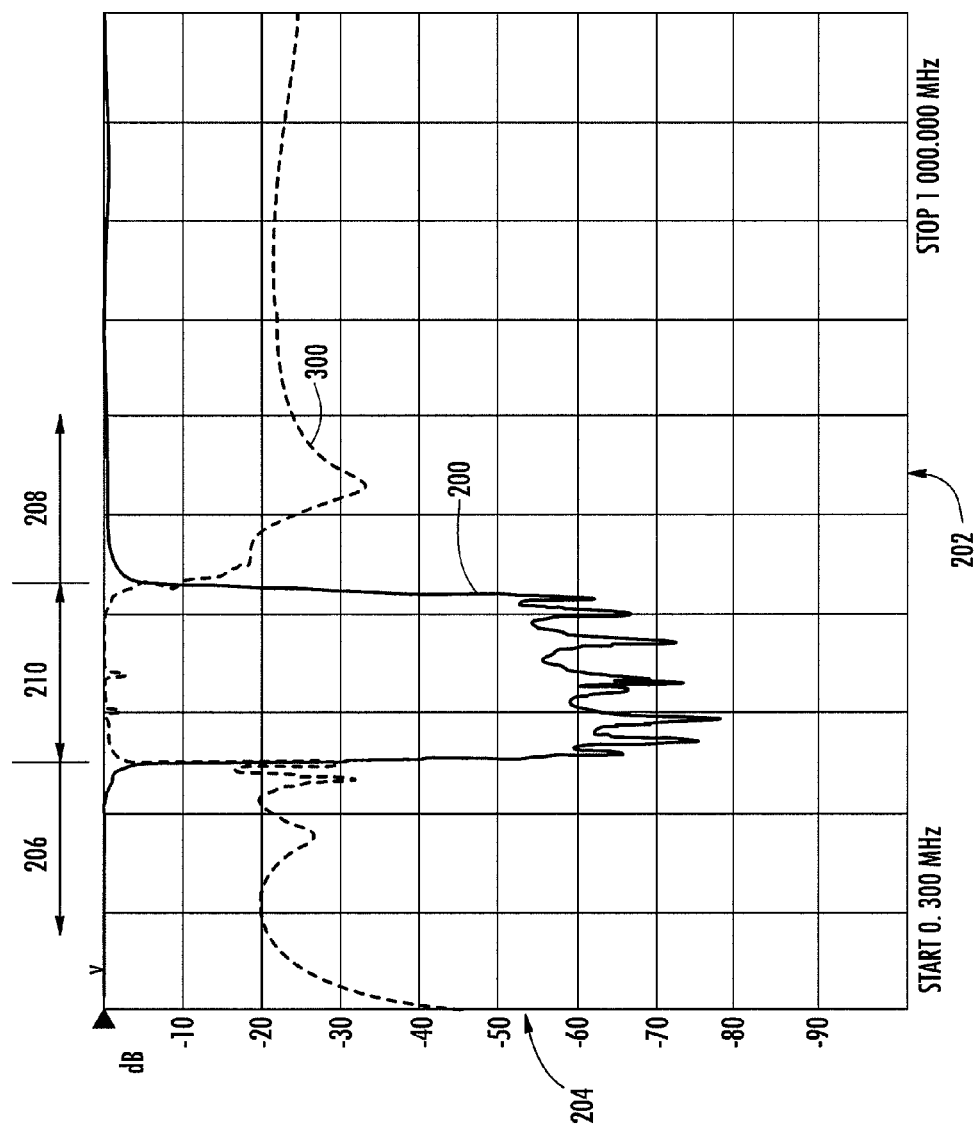
Figure 5:
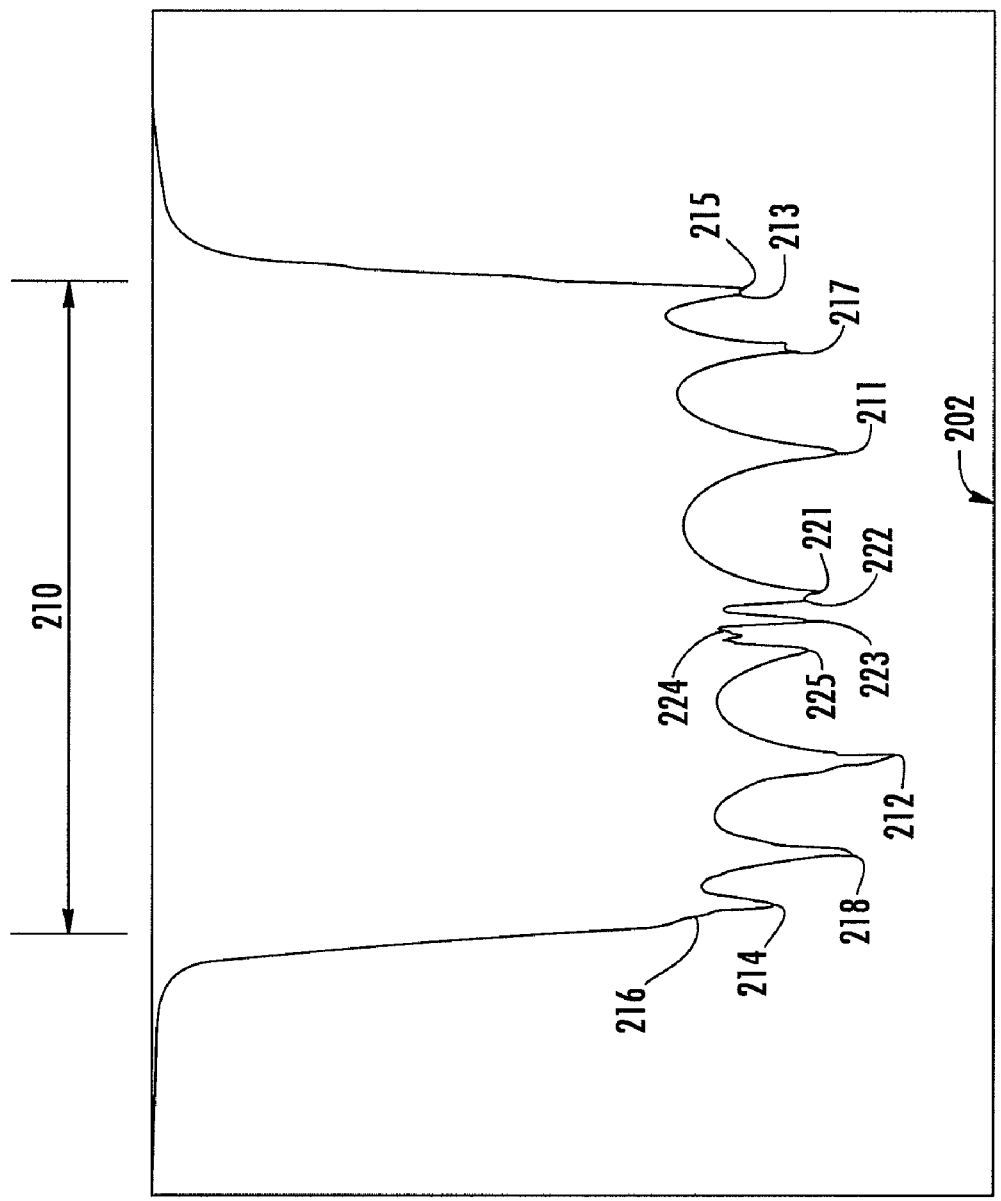

FIG. 4 graphically plots the frequency-dependent transmission and reflection functions of a particular band-stop filter constructed according to FIG. 2; and FIG. 5 graphically plots the transmission function of FIG. 4 in the vicinity of an intermediate frequency band.

DETAILED DESCRIPTIONS

The present invention now will be described more fully hereinafter with reference to the accompanying drawings in which some but not all embodiments of the inventions are shown. Indeed, the invention may be embodied in many different forms and should not be construed as limited to the embodiments set forth herein; rather, these embodiments are provided so that this disclosure will satisfy applicable legal requirements. Like numbers refer to like elements throughout.

Figure 1:
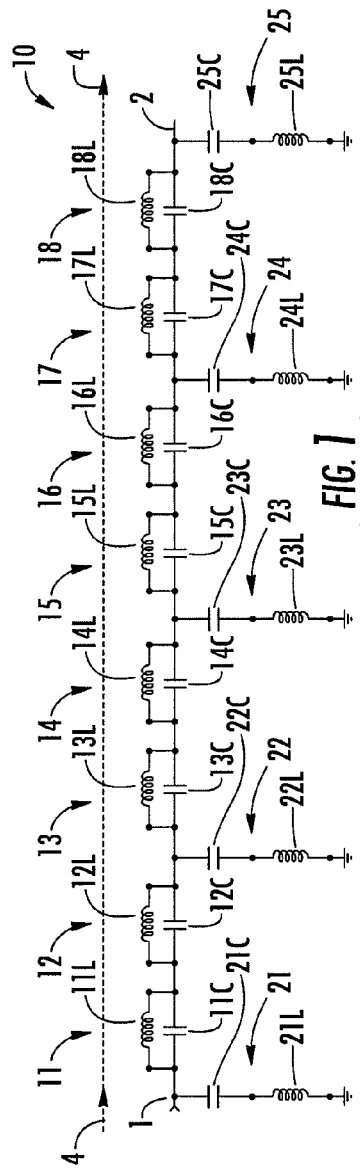
FIG. 1 is a generic circuit diagram of the prior art.

A generic circuit diagram of the prior art is shown in FIG. 1. The diagram represents the components of a band-stop filter 10, and the electrical connections among the components. As generally understood, the generic circuit diagram need not relate to particular spatial dispositions of the components. Any particular circuit constructed in accordance with the diagram of FIG. 1 may or may not have a high degree of visible likeness to the diagram. The diagram generically represents a ninth-order elliptic Chebyshev band-stop filter. A transmission path 4 is defined along multiple tank elements 11, 12, 13, 14, 15, 16, 17 and 18, which are in ordered series electrical communication with each other. Each particular tank element includes a particular capacitor (C) and a particular inductor (L) in parallel electrical communication with each other. For example, the tank element 11 includes the capacitor 11C and the inductor 11L in parallel communication with each other, the tank element 12 includes the capacitor 12C and the inductor 12L in parallel electrical communication with each other, and so forth.

A transmission path 4 is defined along the tank elements. First and second contacts 1 and 2 define opposing respective ends of the transmission path. Transmission is understood to occur when an oscillating electrical signal is presented at a first contact 1 and, in response to the presented signal, a same-frequency oscillating electrical signal develops at a second contact 2. The signal developed at the second contact may be attenuated relative to the signal presented at the first contact due to, for example: reflections from the filter 10 back toward the source of the presented signal; signal losses along multiple shunt elements 21, 22, 23, 24, and 25; and general signal degradation due to resistive energy losses.

Like the tank elements, each particular shunt element includes a particular capacitor (C) and a particular inductor (L). Unlike the tank elements, however, each shunt element includes a capacitor and an inductor in series electrical communication with each other. For example, the shunt element 21 includes the capacitor 21C and the inductor 21L in series electrical communication with each other, the shunt element 22 includes the capacitor 22C and the inductor 22L in series electrical communication with each other, and so forth.

It is by arbitrary choice that signal propagation from the first contact 1 to the second contact 2 is described herein as transmission. These descriptions might have oppositely described signal propagation from the second contact 2 to the first contact 1 as transmission. The filter 10 appears to be symmetric about the shunt element 23 in the generic circuit diagram of FIG. 1. However, any particular filter constructed according to the generic circuit diagram of FIG. 1 will have particular capacitors and inductors in each of the tank and shunt elements. The selections of those capacitors and inductors may prevent symmetry and may result in signal propagation properties that are different for propagation in opposing directions across the constructed filter.

Transmission requires some amount of passage of a signal by each and every one of the tank elements. Attenuation, however, can be caused by signal passage along any one of the multiple shunt elements. It may be instructive to consider that a high-frequency signal is passed with little attenuation by each capacitor of the tank elements while being prevented from reaching ground by the inductors of the shunt elements. Similarly, it may be instructive to consider that a low-frequency signal is passed with little attenuation by each inductor of the tank elements while being prevented from reaching ground by the capacitors of the shunt elements. In the context of these considerations, the generic circuit diagram of FIG. 1 can be understood to represent a filter, through which low and high-frequency signals pass along the transmission path 4 from the first contact 1 to the second contact 2. In that context, the filter 10 can be understood to be a band-stop filter, by which signals in an intermediate frequency band are expected to be attenuated due to resonances in the tank elements. Thus, the tank elements can be considered to impede signals in the intermediate frequency band. Signals in the intermediate frequency band are expected to be further reduced due to resonances in the shunt elements, which shunt elements can be considered to pass signals in the intermediate frequency band to ground. Accordingly, it is expected that signals in a low-frequency band will be generally transmitted, that signals in a high-frequency band will be generally transmitted, and that the low and high-frequency bands will be separated by the intermediate frequency band. It is generally believed that the intermediate frequency band is predetermined by the selection of capacitors and inductors in any particular filter constructed according to the generic circuit diagram of FIG. 1. Also, any particular circuit in accordance with the diagram is expected to have a rippled frequency-dependent transmission function within the intermediate frequency band.

The following descriptions, however, are not bound to the above-described elementary instructive considerations, general beliefs, and expectations generically associated with band-stop filters of the type represented by the generic circuit diagram in FIG. 1. The following descriptions relate to novel and useful circuit elements that provide, through invention, uncommon benefits over previous circuit elements that were constructed in accordance with the generic circuit diagram. Accordingly, though the inventive circuit elements described herein with references to FIGS. 2-5 are in accordance with the generic circuit diagram, the following descriptions relate to circuit elements that are novel, non-obvious, and advantageous.

A circuit element 100, in accordance with at least one embodiment of the invention, is shown in FIG. 2. The circuit element 100 is constructed in accordance with the generic circuit diagram of FIG. 1. Thus, the circuit element 100 represents a ninth-order elliptic Chebyshev band-stop filter. A first contact 101 and a second contact 102 define opposing ends of a transmission path 104. Signal propagation progressing from the first contact 101 to the second contact 102 is described herein as transmission. That is, the transmission functions provided in FIGS. 4-5 represent measured transmission properties with regard to signal propagation directed from the first contact 101 to the second contact 102.

The transmission path 104 is defined along multiple tank elements 111, 112, 113, 114, 115, 116, 117 and 118, which are in series electrical communication with each other. Each particular tank element includes a particular capacitor (C) and a particular inductor (L) in parallel electrical communication with each other. For example, the tank element 111 includes the capacitor 111C and the inductor 111L in parallel communication with each other, the tank element 112 includes the capacitor 112C and the inductor 112L in parallel electrical communication with each other, and so forth.

The circuit element 100 also includes multiple shunt elements 121, 122, 123, 124, and 125. Each shunt element includes a capacitor and an inductor in series electrical communication with each other. For example, the shunt element 121 includes the capacitor 121C and the inductor 121L in series electrical communication with each other, the shunt element 122 includes the capacitor 122C and the inductor 122L in series electrical communication with each other, and so forth. The shunt elements are all in electrical communication with a grounding element 105. The grounding elements 105 and 106 may each be literally in communication with earth ground or any other charge reservoir at a reference potential defined as ground potential.

The circuit element 100 includes electrically conductive pads 141, 142, 143, and 144, each of which connects two next neighbor tank elements into series electrical communication. For convenience, these descriptions refer to these pads as series pads. For example, series pad 141 connects into series electrical communication the tank element 111 and the tank element 112, which is a next neighbor of the tank element 111. Similarly, series pad 142 connects into series electrical communication the tank element 113 and the tank element 114, which is a next neighbor of the tank element 113.

The phrase "next neighbor," as used herein, relates to any two of the tank elements that are not separated by any other tank element in the transmission path 104. For example, the tank element 117 is a next neighbor to both the tank element 116 and the tank element 118. The tank element 118 has only the tank element 117 as a next neighbor because the tank element 118 is separated, along the transmission path 104, from every other tank element by at least the tank element 117. That a tank element has two next neighbor tank elements does not imply that the tank elements are actually equidistantly disposed from each other. Indeed, the tank elements in FIG. 2 are illustrated as equidistantly disposed from each other such that each two next neighbor tank elements are uniformly spaced from each other by the same distance as every other two next neighbor tank elements. However, except where explicitly stated, descriptions herein relating tank elements as next neighbors does not relate to any particular uniform or non-uniform spacings among the tank elements.

Furthermore, in the sense that signal propagation progressing along the transmission path 104 from the first contact 101 to the second contact 102 is described herein as transmission, the tank element 116 is described herein as preceding the tank element 117 in the transmission path. Similarly, the tank element 118 is said to follow the tank element 117 in the transmission path. Accordingly, a signal or current is described herein as progressing along the transmission path when the signal or current flows to a particular tank element from another tank element preceding the particular tank element, or when the signal or current flows from the particular tank element to another tank element following the particular tank element.

The circuit element also includes the electrically conductive pads 151, 152, and 153, which connect the tank elements into electrical communication with the shunt elements. For convenience, these descriptions refer to these pads as shunt pads 151, 152, and 153. Each particular shunt pad connects two particular next neighbor tank elements into series electrical communication with each other, and connects the two tank elements into electrical communication with a particular shunt element. For example, shunt pad 151 connects into series electrical communication the tank element 112 and the tank element 113, which is a next neighbor of the tank element 112. The shunt pad 151 also connects the tank elements 112 and 113 into electrical communication with the shunt element 122. Similarly, shunt pad 152 connects into series electrical communication the tank element 114, the tank element 115, and the shunt element 123. The tank elements 111 and 118 are connected into electrical communication with the shunt elements 121 and 125 by the first and second contacts 101 and 102, respectively.

The tank elements 111-118 in FIG. 2 correspond respectively to the tank elements 11-18 in FIG. 1. The shunt elements 121-125 in FIG. 2 correspond respectively to the shunt elements 21-25 in FIG. 1. The contacts and pads in FIG. 2 respectively correspond to particular connections represented by lines in FIG. 1. Thus, any particular circuit element constructed in accordance to the circuit element 100 in FIG. 2 is constructed in accordance with the generic circuit diagram of FIG. 1. FIG. 2 nonetheless conveys more information than FIG. 1. For example, FIG. 2 conveys at least some information regarding the spatial dispositions of the various elements represented therein. It has been determined that, relative to at least one band-stop filter previously constructed merely in accordance with the generic circuit diagram of FIG. 1, at least one band-stop filter constructed in accordance with circuit element 100 of FIG. 2 provides reduced insertion loss according to increased transmission in the low-frequency pass band 206 and in the high-frequency pass band 208 in FIG. 4. It has also been determined that the band-stop filter constructed in accordance with FIG. 2 provides increased return loss according to decreased reflection in the low and high frequency pass bands 206 and 208. It has furthermore been determined that the band-stop filter constructed in accordance with FIG. 2 provides increased attenuation in a selected frequency band according to decreased transmission in the intermediate-frequency stop band 210 in FIG. 4. These improvements toward reduced insertion loss and increased return loss in the pass bands, and toward increased attenuation in the stop band, are believed to result from a combination of features present in the circuit element 100. The present features are each believed to minimize or at least reduce the mutual couplings that typically occur among the components, particularly among the inductors, of any band-stop filter.

Figure 3:
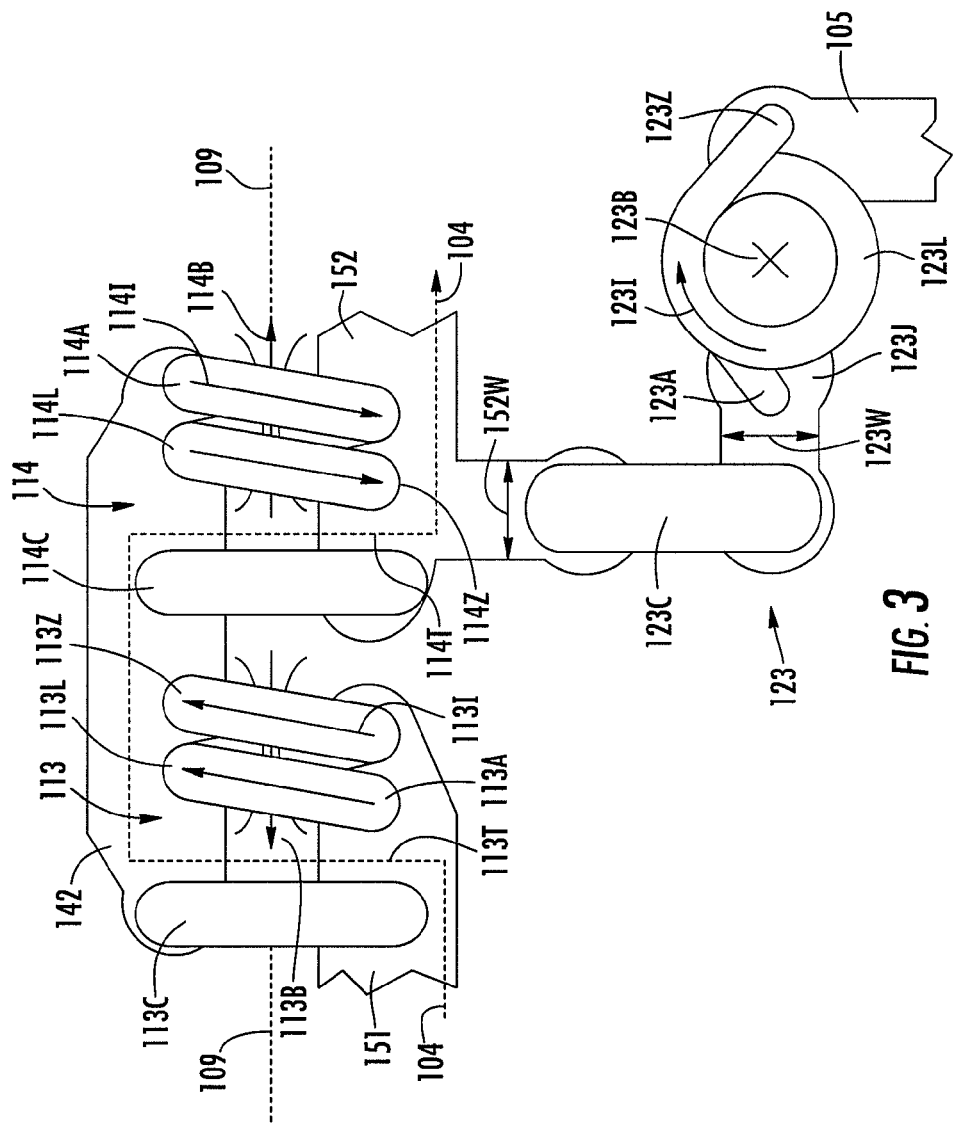
FIG. 3 is a plan view of a representative portion of the circuit element of FIG. 2.

For example, a particular feature present in the circuit element 100 is believed to minimize mutual couplings in any band-stop filter constructed in accordance with FIG. 2. That particular feature relates to the dispositions and structures of the inductors of the tank elements. FIG. 3 illustrates a representative portion of the circuit element 100. An understanding of this representative portion is instructive toward understanding the circuit element 100 as a whole. FIG. 3 illustrates next neighbor tank elements 113 and 114, the series pad 142, the shunt element 123, and portions of the shunt pads 151 and 152. The magnetic fields 113B and 114B generated respectively by the inductors 113L and 114L are shown in FIG. 3 as oppositely directed.

Generally, an inductor constructed as a helical coil disposed about an axis generates a directional internal magnetic field, the field having at least dipolar characteristics, upon passage of electrical current through the coil. The internal magnetic field is generally parallel to the axis about which the coil is turned. This can be understood with consideration toward the "right-hand-rule" employed by physicists and engineers and with consideration toward defining electrical current as hole flow through a conductor, wherein hole flow is defined to have a direction opposite that of the net flow of conducting electrons in the conductor. The inductor 113L is illustrated in FIG. 3 as a clockwise turned coil of conducting wire having one and one half turns about the axis 109. Opposing ends 113A and 113Z of the inductor coil are respectively electrically connected to the shunt pad 151 and the series pad 142. Similarly, the inductor 114L is illustrated in FIG. 3 as a clockwise turned coil disposed about the axis 109. Opposing ends 114A and 114Z of the inductor are respectively electrically connected to the series pad 142 and the shunt pad 152. The coil of inductor 113L and the coil of inductor 114L are each disposed about the common axis 109. Thus each is expected to generate an internal magnetic field parallel to the common axis. It should be understood that, regarding internal magnetic fields of inductors, descriptions herein relate to internal magnetic fields along the approximate centers of the inductors without regard to edge effects and complex field-line patterns associated with dipolar and higher order multi-pole magnetic fields.

FIG. 3 depicts an instant when instantaneous electrical current 113I flows to the series pad 142 through the inductor 113L and instantaneous electrical current 114I flows from the series pad through the inductor 114L. Thus, the currents 113I and 114I are progressing along the transmission path 104. In that instant, the magnetic field 113B generated by the inductor 113L directionally opposes the magnetic field 114B generated by the inductor 114L. The fields 113B and 114B are directionally opposed due to the constructions and dispositions of the inductors. The circuit element 100, as a whole, may be now better understood in view of FIG. 3. The multiple tank elements 111-118 are disposed along the common axis 109. The inductor of each tank element is disposed along the common axis and is structured to generate an internal magnet field parallel to the common axis upon passage of electrical current progressing along the transmission path through the inductor. The magnetic field so generated by the inductor of each particular tank element directionally opposes the magnetic field so generated by the inductor of each other tank element that is a next neighbor to the particular tank element. In other words, as respective electrical currents progress along the transmission path 104 through the inductors 111L and 112L, the inductors 111L and 112L generate respective internal magnetic fields that oppose each other. Similarly, as respective electrical currents progress along the transmission path 104 through the inductors 112L and 113L, the 112L and 113L inductors generate respective internal magnetic fields that oppose each other, and so forth.

It is believed that inductors structured to generate such opposing magnetic fields relate to: minimizing or at least reducing the mutual couplings among the inductors of a band-stop filter constructed in accordance with FIGS. 2-3; improvements toward reduced insertion loss and increased return loss in the pass bands of such a stop filter; and improvements toward increased attenuation in the stop band of such a filter. It should be understood that these descriptions relate to the structures of the inductors, which structures are maintained despite the cessations of electrical currents through the inductors. These descriptions recite instantaneous currents in order to describe the benefits of embodiments of the invention. A band-stop filter can be constructed in accordance with these descriptions without instantaneous currents necessarily present.

FIG. 2 and FIG. 3 are related at least in that each of inductors 111L, 115L, and 117L (FIG. 2), and the respective magnetic fields generated by these inductors upon respective currents progressing along the transmission path 104 through the inductors, can be understood in view of the inductor 113L (FIG. 3), the magnetic field 113B, and the current 113I. That is, each of inductors 111L, 115L, and 117L are constructed as clockwise turned coils in at least one band-stop filter constructed in accordance with FIGS. 2-3. Similarly, each of inductors 112L, 116L, and 118L (FIG. 2) can be understood in view of the inductor 114L (FIG. 3). It should be understood that opposing magnetic fields among the inductors of next neighbor tank elements can be achieved by various arrangements of clockwise and counter-clockwise turned coils in view of these descriptions and figures. Thus, these descriptions relate to circuit elements having next neighbor tank elements generating opposing magnetic fields whether or not inductors are constructed as clockwise or counter clockwise turned coils. The clockwise turned coils represented in FIGS. 2-3 are just examples by which the benefits of these descriptions can be achieved.

Another particular feature present in the circuit element 100 believed to minimize mutual couplings in any band-stop filter constructed in accordance with circuit element 100 relates to the dispositions of the capacitors of the tank elements. As shown in FIG. 3, the capacitor 114C is disposed along the common axis between the inductor 113L and the inductor 114L. Placement of the capacitor between the inductors is believed to inhibit mutual coupling between the inductors 113L and 114L. FIG. 2 and FIG. 3 are related at least in that at least one of the capacitors (C) of any two next neighbor tank elements is disposed on the common axis 109 between the inductors (L) of the tank elements. For example, the capacitor 112C is disposed between the inductors 111L and 112L of the next neighbor tank elements 111 and 112, the capacitor 113C is disposed between the inductors 112L and 113L of the next neighbor tank elements 112 and 113, and so forth. Placement of the capacitors between the inductors is believed to be related to minimizing or at least reducing the mutual couplings among the inductors of a band-stop filter constructed in accordance with FIGS. 2-3, and may be related to improvements toward reduced insertion loss and increased return loss in the pass bands of such a stop filter and improvements toward increased attenuation in the stop band of such a filter.

Another particular feature present in the circuit element 100 (FIG. 2) believed to minimize mutual couplings in any band-stop filter constructed in accordance with the circuit element 100 relates to the dispositions and structures of the inductors of the shunt elements. Each inductor of each shunt element is structured to generate, upon passage of electrical current through the shunt element, a respective internal magnetic field (B) that is perpendicular to the internal magnetic fields of the inductors of the tank elements. For example, in FIG. 3, the inductor 123L is illustrated as a clockwise turned coil of conducting wire having at least one and one half turns about an axis 123X that is perpendicular to the common axis 109. In the instant of FIG. 3, an instantaneous electrical current 123I passes through the inductor 123L. The current progresses from a first end 123A to an opposing second end 123Z of the inductor in progressing away from the shunt pad 152 and toward the grounding element 105 (FIG. 2). In that instant, the inductor 123L generates the internal magnetic field 123B that is perpendicular to each of the internal magnetic fields 113B and 114B respectively generated by the inductors 113L and 114L of the tank elements 113 and 114. This can be understood, for example, in view of the common axis 109. The internal magnetic fields generated by the inductors of the tank elements are parallel to the common axis 109, and the magnetic field 123B generated by the inductor 123L of the shunt element 123 is perpendicular to the common axis. The axis 123X (FIG. 3) about which the coil of the inductor 123L is turned, and the internal magnetic field 123B generated by the coil, are parallel and coincident. The axis 123X and the field 123B are accordingly commonly represented in FIG. 3 without ambiguity.

Each of inductors 121L-125L in FIG. 2 is constructed and disposed similarly to the inductor 123L in FIG. 3 in that each is structured to generate a respective internal magnetic field (B) that is perpendicular to the internal magnetic fields of the inductors 111L-118L of the tank elements 111-118. This can be understood, for example, in view of the common axis 109. The internal magnetic fields generated by the inductors of the tank elements are parallel to the common axis 109. The magnetic field 121B generated by the inductor 121L of the shunt element 121 is perpendicular to the common axis 109, the magnetic field 122B generated by the inductor 122L of the shunt element 122 is also perpendicular to the common axis, and so forth. It is believed that the structures and dispositions of the inductors of the shunt elements in FIG. 2 minimize or at least reduce mutual couplings between the inductors of the shunt elements and the inductors of the tank elements.

Another particular feature present in the circuit element 100 believed to minimize mutual couplings in any band-stop filter constructed in accordance with the circuit element 100 relates to the itinerary of the transmission path 104 (FIG. 2). The transmission path 104 progresses sequentially from the first contact 101, through the tank element 111, along the series pad 141, through the tank element 112, along the shunt pad 151, through the tank element 113, along the series pad 142, through the tank element 114, and so forth. Each tank element defines a respective transmission-path portion (T) that crosses the common axis 109. That is, the tank elements 111-118 define the respective transmission path portions 111T-118T, each of which crosses the common axis 109. Each two next neighbor tank elements define respective transmission path portions (T) that cross the common axis in opposing directional senses. For example, the tank element 112 defines a transmission path portion 112T representing progression from the series pad 141 to the shunt pad 151, with the tank element 112 following the series pad 141 and preceding the shunt pad 151 in the transmission path 104. The tank element 113, which is a next neighbor of the tank element 112, defines a transmission path portion 113T representing progression from the shunt pad 151 to the series pad 142. The series pads and the shunt pads are disposed along opposing sides of the tank elements with regard to the common axis. Thus, the transmission path portions 112T and 113T defined by the next neighbor tank elements 112 and 113 represent crossings of the common axis in opposing directional senses. Accordingly, the tank elements and the electrically conductive series and shunt pads define a serpentine transmission path 104. The serpentine transmission path 104 crisscrosses the common axis. Currents and signals progressing along the transmission path 104 cross the common axis 109 multiple times respectively through multiple tank elements regardless of whether the current and signals pass through the inductors or capacitors of the tank elements. Such dispositions of the tank elements and series and shunt pads, as shown in FIG. 2, define the serpentine transmission path 104 and are believed to minimize mutual couplings in any band-stop filter constructed in accordance with the circuit element 100.

A particular feature present in the circuit element 100 believed to provide performance benefits in any band-stop filter constructed according to these descriptions relates to interference isolation benefits provided by the grounding elements 105 and 106. The grounding elements 105 and 106 extend along opposing sides of the tank elements, with the shunt elements disposed between the tank elements and the grounding element 105. The grounding element 106 defines spark gaps 161 and 162 proximal the first and second contacts 101 and 102, respectively. Electrical communication between the grounding element 106 and the tank elements is inhibited by the spark gaps 161 and 162. In the event of overcharging or excessive voltage occurring at the first and second contacts, electrical discharge currents sparking across the spark gaps 161 and 162 may protect the circuit element 100 and any devices connected thereto upstream and downstream along the transmission path beyond the circuit element. Similarly, grounding element 105 defines spark gaps 163 and 164 proximal the first and second contacts 101 and 102, respectively.

The grounding element 105 is in electrical communication with the tank elements 111-118 through the shunt elements 121-125. The grounding element can be understood to receive currents in predetermined frequency bands shunted to ground through the shunt elements according to the selections of the inductors and capacitors of the shunt elements. The first contacts 101 and 102, the series pads 141-144, the shunt pads 151-153, and the grounding elements 105 and 106 are all disposed in a common plane defined along the front face of the planar circuit board 108. The first contact 101, the grounding element 105, the second contact 102, and the grounding element 106 are interrupted from together completely surrounding the series pads and the shunt pads in the common plane only by the spark gaps 161-164. It is believed that the grounding strips serve to promote isolation of the circuit element 100 from outside interference sources, such as RF noise sources. Though the tank and shunt elements may each be elevated from the common plane defined by the circuit board upon which the elements are mounted, it is believed the grounding elements in the common plane promote isolation in a volume of space beyond the common plane and encompassing the tank and shunt elements.

A particular feature present in the circuit element 100 believed to provide performance benefits in any band-stop filter constructed according to these descriptions relates to the duplication of circuit traces on opposing faces of the circuit board. The circuit traces include the conductive pads, contacts, and grounding elements. Front face and back face conducting circuit traces are disposed on opposing faces of the circuit board 108 in one-to-one correspondence. The front face refers to that face of the circuit board upon which the tank and shunt elements are mounted. The series pads 141-144, the shunt pads 151-153, the grounding elements 105-106, and the contacts 101-102 are all disposed on the front face (FIG. 2) of the circuit board 108. Respectively similar series pads, shunt pads, grounding elements, and contacts are all disposed on the opposing back face of the circuit board in one-to-one correspondence with the pads, grounding elements, and contacts disposed on the front face. Similarly, the electrically conductive jumper pads 121J-125J, which connect the capacitors 121C-125C of the shunt elements 121-125 into series electrical communication with the respective inductors 121L-125L, are disposed on the front face of the circuit board in one to one correspondence with jumper pads disposed on the opposing back face of the board. Thus, each conductive pad, contact, and grounding element shown in FIG. 3 disposed on the front face of the circuit board directly opposes a respective uniquely corresponding pad, contact, and grounding element disposed on the back face of the circuit board.

By corresponding to and opposing each other, each corresponding pair of pads, contacts, and grounding elements defines a pair of identical respective footprints parallel to the circuit board. For example, a series pad disposed on the back face of the circuit board corresponds to and opposes the series pad 141 disposed on the front face of the circuit board. The back-face series pad corresponding to the front-face series pad 141 lies beneath the series pad 141 in FIG. 2 and defines, parallel to the circuit board, a footprint identical to the foot print defined by the series pad 141.

With regard to front-face electrical connections, respective pairs of conducting leads extend from each capacitor and conductor and electrically connect the capacitors and inductors to the appropriate front-face pads, contacts, and grounding elements. The leads may be so connected, for example, by soldered connections. For example, opposing ends 113A and 113Z (FIG. 3) of the inductor coil 113 are soldered or otherwise electrically connected to the shunt pad 151 and series pad 142, respectively. Indeed, each of the capacitor 113C, the capacitor 114C, and the inductor 114L has a respective lead electrically connected to the series pad 142. Thus, the series pad 142 electrically connects the tank element 113 to the tank element 114.

With regard to back-face electrical connections, each back-face pad, contact, and grounding element duplicates the connections made by the corresponding front-face pad, contact, and grounding element. For example, a back-face series pad corresponding to the front-face series pad 142 additionally electrically connects together the tank elements 113 and 114. The conducting leads of the capacitors and inductors pass through holes defined in the circuit board and electrically connect the capacitors and inductors to the appropriate back-face pads, contacts and grounding elements. Thus, each particular conductive back-face pad electrically connects together the same circuit components electrically connected together by the corresponding front-face pad.

An additional advantage provided by the circuit element 100 of FIG. 2 relates to the widths of the circuit traces. The circuit traces include the conductive pads, contacts, and grounding elements. Typical circuit traces formed on planar circuit boards have widths, as measured in the planes of the circuit boards, in a range between twenty thousandths of an inch and twenty-five thousandths of an inch. The widths of the conductive pads, contacts, and grounding elements in the circuit element 100 of FIG. 2 are generally between fifty thousandths of an inch and seventy-five thousandths of an inch. For example, the width 152W (FIG. 3) of the shunt pad 152 proximal the shunt element 123, and the width 123W of the jumper pad 123J are each approximately fifty thousandths of an inch. The circuit board 108 is approximately thirty-two thousandth of an inch deep, as measured from the front face to the back face.

A particular band-stop filter in accordance with FIG. 2 and Tables 1-2 has been constructed and its frequency-dependent transmission and reflection functions have been evaluated between three hundred kilohertz and one-thousand megahertz frequencies. These functions are provided in FIG. 4. Specifications for each capacitor are provided in Table 1 below in order to provide a thorough characterization of the construction of the particular constructed band-stop filter. Specifications for each inductor are provided in Table 2 below toward the thorough characterization. Regarding the capacitors according to FIG. 2 and Table 1, each is of the common ceramic disk type having a pair of conducting leads extending from the capacitor in the plane of the disk. Table 1 provides capacitance values in pico-farad (pF) units along with temperature coefficient (TEMP. COEFF.) values, which are negative indicating a measure of decreasing capacitance value with increasing temperature.

TABLE 1

| CAPACITOR | CAPACITANCE (pF) | TEMP. COEFF. |
|---|---|---|
| 111C | 12 | −150 |
| 112C | 16 | −150 |
| 113C | 15 | −75 |
| 114C | 27 | −150 |
| 115C | 18 | −75 |
| 116C | 27 | −150 |
| 117C | 15 | −75 |
| 118C | 20 | −150 |
| 121C | 2.4 | −330 |
| 122C | 4.7 | −150 |
| 123C | 3.9 | −150 |
| 124C | 4.7 | −150 |
| 125C | 2.7 | −330 |

Regarding the inductors according to FIG. 2 and Table 2, each is constructed as a hollow air-core coil. Twenty-six gauge copper magnet wire, having a thin insulating sheath, was used in the construction of each inductor. Table 2 provides the number of turns (TURNS) in each coil and the internal diameter (INT. DIAM.), in units of inches, of each coil. Turns are expressed in half-integer counts because opposing ends of the coil wire of any particular one of the inductors define conducting leads extending in generally opposing directions. Though each of the inductors in FIG. 2 are represented by coils, each having one and one-half turns, the particular band-stop filter constructed in accordance with Tables 1 and 2 are in accordance with FIG. 2 despite that Table 2 specifies higher turn numbers in some of the inductors. It should be understood that FIG. 2 and descriptions herein relate to many variations toward the turn numbers in the inductor coils, toward the capacitance values of the capacitors, and toward other construction parameters in any circuit element constructed in accordance with FIG. 2.

TABLE 2

| INDUCTOR | TURNS | INT. DIAM. |
|---|---|---|
| 111L | 2.5 | 0.086 |
| 112L | 2.5 | 0.093 |
| 113L | 1.5 | 0.100 |

TABLE 2-continued

| INDUCTOR | TURNS | INT. DIAM. |
|---|---|---|
| 114L | 2.5 | 0.077 |
| 115L | 1.5 | 0.086 |
| 116L | 2.5 | 0.077 |
| 117L | 1.5 | 0.107 |
| 118L | 2.5 | 0.086 |
| 121L | 9.5 | 0.077 |
| 122L | 6.5 | 0.077 |
| 123L | 7.5 | 0.077 |
| 124L | 6.5 | 0.077 |
| 125L | 9.5 | 0.077 |

The frequency-dependent transmission function 200 and reflection function 300 evaluated for the particular band-stop filter constructed in accordance with FIG. 2 and Tables 1-2 are shown in FIG. 4 as solid and dashed curves, respectively. Each is represented along a frequency axis 202 in a frequency range between three-hundred kilohertz and one-thousand megahertz. The transmission function 200 represents the intensity of an oscillating electrical signal developed at the second contact 102 (FIG. 2) in response to an oscillating electrical signal presented as a test function at the first contact 101. The reflection function 300 (FIG. 4) represents the intensity of signals returning from the circuit element 100 (FIG. 2) through the first contact to the source of the signal upstream of the circuit element. Thus, the transmission and reflection functions represented in FIG. 4 are defined with regard to the transmission path 104. Intensities are represented in decibels (dB), in relation to the intensity of the test function, along a logarithmic axis 204.

FIG. 4 demonstrates that, relative to at least one previously known and available band-stop filter, the particular band-stop filter constructed in accordance with FIG. 2 and Tables 1-2 provides: reduced insertion loss according to increased values for the transmission function 200 in the low-frequency pass band 206 and in the high-frequency pass band 208; increased return loss according to decreased values for the reflection function 300 in the low and high frequency pass bands 206 and 208; and increased attenuation according to decreased values for the transmission function 200 in the intermediate-frequency stop band 210. The intermediate-frequency stop band 210 is situated between a first frequency at approximately two-hundred and fifty megahertz and a second frequency at approximately four-hundred and twenty megahertz. The stop band 210 corresponds to a range of CATV channels nominally known as channels twenty-nine through fifty-eight in the CATV industry. This particular stop band range is predetermined by selection of the capacitors and inductors according to Tables 1-2. Other stop band ranges toward other CATV channels, and toward filtering applications beyond CATV networks, are within the scope of these descriptions. Benefits and advantages of the circuit element 100 of FIG. 2 are not limited to the intermediate frequency stop band 210 of FIGS. 4-5.

The transmission function 200 is shown in particular about the intermediate-frequency stop band 210 in FIG. 5. A rippled transmission function is demonstrated in this frequency domain. A procedure for matching the performance of any particular band-stop filter to a reference filter has been developed. Matching performances relates to matching the transmission functions of a number of similarly constructed band-stop filters, each constructed according to FIG. 2 and Tables 1-2. For example, a number of band-stop filters can be carefully matched to required specifications. The procedure entails adjusting the physical structures of the inductors in a particular order. In the procedure, the tank-element inductors may be split and the shunt-element inductors may be leaned, in the particular order, until ordered characteristics of the transmission function of the band-stop filter under adjustment matches a reference transmission function, such as that of FIG. 5. Splitting an inductor coil entails extending a fine tool, such as the tip of a stylus, between turns of the coil to widen the coil. This is not expected to dramatically alter the orientation of the coil. If properly split, a tank-element inductor coil (111L-118L) remains disposed about the common axis 109 (FIG. 2) and remains structured to generate an internal magnetic field that is parallel to the common axis. Leaning a shunt-element inductor coil entails extending a fine tool into the air core of the coil and leaning the top of the coil toward the common axis with regard to the perspective provided by FIG. 2. If properly leaned, the coil of a shunt-element inductor remains turned about a leaned axis that is perpendicular to the common axis 109, although the leaned axis may not be perpendicular to the planar circuit board 108. If properly leaned, a shunt-element inductor coil (121L-125L) remains structured to generate an internal magnetic field that is perpendicular to the common axis 109, and that is perpendicular to the internal magnetic fields generated by the inductors of the tank elements.

Table 3 provides the ordered steps of the developed procedure. For each step, a particular inductor is identified, either splitting or leaning treatment is prescribed, and a corresponding valley is identified. In each step, the identified inductor is to be adjusted according to the prescribed treatment until the corresponding valley in the transmission function of the band-stop filter under adjustment matches that of a reference transmission function, such as that of FIG. 5, with regard to the dispositions of the valleys along the frequency axis 202. The entire procedure may be repeated until desired performance matching is achieved. Any particular inductor should be left unadjusted if the corresponding valley already matches that of the reference transmission function. Where valleys are closely disposed or coincide along the frequency axis 202, the identified inductors are to be singly or all adjusted toward matching the transmission function of the band-stop filter under adjustment to that of the reference transmission function. For example, the valleys 213 and 215 are closely disposed in FIG. 5. Accordingly, a user may adjust either one or both of inductors 113L and 115L in attempting to match transmission functions. Furthermore, some valleys may not be discretely separated from other nearby features of the rippled transmission function. For example, the valley 216 in FIG. 5 helps to define a lower frequency margin of the stop band 210 without appearing as a discrete local minimum in the plunging transmission function in the frequency vicinity of the valley. Nonetheless, a user is directed to adjust the inductor 116L in view of the transmission function in the vicinity of the corresponding valley 216.

TABLE 3

| STEP | INDUCTOR | TREATMENT | VALLEY |
|---|---|---|---|
| 1 | 115L | SPLIT | 215 |
| 2 | 113L | SPLIT | 213 |
| 3 | 117L | SPLIT | 217 |
| 4 | 111L | SPLIT | 211 |
| 5 | 121L | LEAN | 221 |
| 6 | 122L | LEAN | 222 |
| 7 | 123L | LEAN | 223 |
| 8 | 124L | LEAN | 224 |
| 9 | 125L | LEAN | 225 |
| 10 | 112L | SPLIT | 212 |

TABLE 3-continued

| STEP | INDUCTOR | TREATMENT | VALLEY |
|------|----------|-----------|--------|
| 11 | 118L | SPLIT | 218 |
| 12 | 114L | SPLIT | 214 |
| 13 | 116L | SPLIT | 216 |

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A circuit element comprising:
   multiple tank elements disposed along a common axis with each tank element preceded by or following at least one other next neighbor tank element, each tank element comprising a capacitor and an inductor in parallel electrical communication with the capacitor, the inductors of the tank elements each comprising a respective conducting wire helically turned about the common axis;
   multiple electrically conductive first pads disposed along a first side of the multiple tank elements, each first pad connecting two next neighbor tank elements into series electrical communication with each other; and
   at least one electrically conductive second pad disposed along a second side of the multiple tank elements, the second side opposite the first side, each second pad connecting the two next neighbor tank elements into series electrical communication with each other;
   the two next neighbor tank elements are connected by the at least one electrically conductive second pad having the two respective inductors of the two tank elements structured to generate respective magnetic fields directionally opposing each other when, concurrently, a first instantaneous electrical current flows to the at least one electrically conductive second pad through one of the two respective inductors and a second instantaneous electrical current flows from the at least one electrically conductive second pad through the other of the two respective inductors;
   the multiple tank elements, multiple electrically conductive first pads, and at least one electrically conductive second pad defining a serpentine transmission path, each of the multiple tank elements defining a respective portion of the serpentine transmission path, each respective portion crossing the common axis.

2. The circuit element according to claim 1, wherein for each particular tank element and next neighbor tank element, at least one of the capacitor of the particular tank element and the capacitor of the next neighbor tank element is disposed on the common axis between the inductor of the particular tank element and the inductor of the next neighbor tank element.

3. A circuit element according to claim 1, each inductor of each tank element structured as an inductor coil that comprises a conducting wire helically turned about the common axis, the circuit element further comprising:
   a shunt element in electrical communication with the at least one electrically conductive second pad, the shunt element comprising an inductor coil that comprises a conducting wire helically turned about an axis that is perpendicular to the common axis.

4. A circuit element according to claim 1, each inductor of each tank element structured as an inductor coil that comprises a conducting wire helically turned about the common axis, the circuit element further comprising:
   a planar circuit board upon which the multiple tank elements are mounted, the circuit board disposed parallel to the common axis;
   a shunt element in electrical communication with the at least one electrically conductive second pad, the shunt element comprising an inductor coil that comprises a conducting wire helically turned about an axis that passes through the circuit board.

5. A circuit element according to claim 1, further comprising:
   a circuit board disposed parallel to the common axis, the circuit board comprising a front face and an opposing back face, the multiple electrically conductive first pads disposed on the front face, the at least one second pad disposed on the front face, and at least one tank element of the multiple tank elements mounted upon the front face;
   multiple electrically conductive third pads in one-to-one correspondence with the multiple electrically conductive first pads pads, each third pad disposed on the back face opposing the corresponding first pad, each third pad and corresponding first pad defining substantially identical respective footprints parallel to the circuit board, and
   at least one electrically conductive fourth pad disposed on the back face, each fourth pad disposed opposite the corresponding second pad, the corresponding fourth pad and the corresponding second pad defining substantially identical respective footprints parallel to the circuit board.

6. A circuit element according to claim 5, each particular third pad further connecting into series electrical communication the same two next neighbor tank elements connected by the first pad corresponding to the particular third pad.

7. A circuit element according to claim 1, further comprising:
   a first grounding element defining a first spark gap, electrical communication between the first grounding element and the multiple tank elements being inhibited at least by the spark gap, the first grounding element extending along the first side of the multiple tank elements;
   a shunt element in electrical communication with the at least one electrically conductive second pad, the shunt element comprising at least one of a capacitor and an inductor; and
   a second grounding element in electrical communication with the shunt element, the second grounding element extending along the second side of the multiple tank elements.

8. The circuit element according to claim 1, further comprising:
   a first contact disposed in a common plane in which the multiple electrically conductive first pads and the at least one electrically conductive second pad are disposed, the first contact in electrical communication with a tank element of the multiple tank elements that defines a first end of the serpentine transmission path;
   a second contact in electrical communication with another tank element of the multiple tank elements that defines a second end of the serpentine transmission path opposing the first end, the second contact disposed in the common plane;

an elongated first grounding element disposed in the common plane along the first side, the first grounding element defining a first spark gap proximal the first contact, the first grounding element defining a second spark gap proximal the second contact; and an elongated second grounding element disposed in the common plane along the second side, the second grounding element defining a third spark gap proximal the first contact, the second grounding element defining a fourth spark gap proximal the second contact, the first contact, the first grounding element, the second contact, and the second grounding element interrupted from together completely surrounding the multiple electrically conductive first pads and the at least one electrically conductive second pad in the common plane only by the first spark gap, the second spark gap, the third spark gap, and the fourth spark gap.

9. A circuit element comprising:

multiple tank elements disposed along a common axis in series electrical communication with each other, the multiple tank elements defining a transmission path in which each tank element is preceded by or followed by at least one other next neighbor tank element, each tank element comprising:

a capacitor; and an inductor in parallel electrical communication with the capacitor, the inductor comprising a conducting wire helically turned about the common axis and structured to generate an internal magnetic field parallel to the common axis upon passage of electrical current progressing along the transmission path through the inductor, the magnetic field so generated by the inductor of each particular tank element directionally opposing the magnetic field so generated by the inductor of each other tank element next neighbor to the particular tank element.

10. A circuit element according to claim 9, the circuit element further comprising:

multiple shunt elements, each in electrical communication with at least one of tank element of the multiple tank elements, each shunt element comprising an inductor structured to generate an internal magnetic field that is perpendicular to the common axis upon passage of electrical current through the shunt element.

11. A circuit element according to claim 9, the circuit element further comprising:

a planar circuit board upon which the multiple tank elements are mounted, the circuit board disposed parallel to the common axis; and multiple shunt elements, each in electrical communication with at least one of tank element of the multiple tank elements, each shunt element comprising an inductor structured to generate an internal magnetic field that passes through the circuit board upon passage of electrical current through the shunt element.

12. A circuit element according to claim 9, the multiple tank elements disposed with at least one capacitor of the multiple tank elements is disposed between each two inductors of the multiple tank elements and with at least one inductor of the multiple tank elements disposed between each two capacitors of the tank elements.

13. A circuit element according to claim 9, further comprising:

multiple electrically conductive first pads disposed along a first side of the multiple tank elements; and multiple electrically conductive second pads disposed along a second side of the multiple tank elements opposite the first side, each tank element electrically connected to two next neighbor tank elements respectively through a first pad of the multiple electrically conductive first pads and a second pad of the multiple electrically conductive second pads.

14. A circuit element according to claim 13, further comprising:

a circuit board disposed parallel to the common axis, the circuit board comprising a front face and an opposing back face, the multiple electrically conductive first and second pads disposed on the front face, at least one tank element of the multiple tank elements mounted upon the front face;

multiple electrically conductive third pads in one-to-one correspondence with the the multiple electrically conductive first pads, the multiple electrically conductive third pads disposed on the back face, each third pad disposed opposite its corresponding first pad, each third pad and corresponding first pad defining substantially identical respective footprints parallel to the circuit board; and multiple electrically conductive fourth pads in one-to-one correspondence with the the multiple electrically conductive second pads, the multiple electrically conductive fourth pads disposed on the back face, each fourth pad disposed opposite its corresponding second pad, each fourth pad and corresponding second pad defining substantially identical respective footprints parallel to the circuit board.

15. A circuit element according to claim 14, each particular first pad electrically connecting two particular tank elements of the multiple tank elements to each other, each third pad corresponding to the particular first pad additionally electrically connecting the two particular tank elements to each other.

16. A circuit element according to claim 13, the circuit element further comprising:

a first contact disposed in a common plane in which the multiple electrically conductive first and second pads are disposed, the first contact in electrical communication with a tank element that defines a first end of the transmission path;

a second contact in electrical communication with another tank element of the multiple tank elements that defines a second end of the transmission path opposing the first end, the second contact disposed in the common plane;

an elongated first grounding element disposed in the common plane along the first side, the first grounding element defining a first spark gap proximal the first contact, the first grounding element defining a second spark gap proximal the second contact; and an elongated second grounding element disposed in the common plane along the second side, the second grounding element defining a third spark gap proximal the first contact, the second grounding element defining a fourth spark gap proximal the second contact, the first contact, the first grounding element, the second contact, and the second grounding element interrupted from together completely surrounding the first pads and the second pads in the common plane only by the first spark gap, the second spark gap, the third spark gap, and the fourth spark gap.

17. A circuit element comprising:
- a first tank element comprising a first capacitor and a first inductor coil, the first inductor coil in parallel electrical communication with the first capacitor;
- a second tank element in series electrical communication with the first tank element, the second tank element comprising a second capacitor and a second inductor coil, the second inductor coil in parallel electrical communication with the second capacitor, the first inductor coil comprising a conducting wire helically turned about a common axis and the second inductor coil comprising a conducting wire helically turned about the same common axis with at least one of the first capacitor and the second capacitor disposed on the common axis between the first inductor coil and the second inductor coil;
- wherein the first and second inductors are structured to generate respective magnetic fields directionally opposing each other when, concurrently, a first instantaneous electrical current flows through the first inductor coil and a second instantaneous electrical current flows through the second inductor coil.

18. A circuit element according to claim 17, further comprising:
- a shunt element in electrical communication with at least one of the first tank element and the second tank element, the shunt element comprising an inductor structured to generate a magnetic field that is perpendicular to the magnetic fields generated by the first inductor coil and the second inductor coil.

19. A circuit element according to claim 17, further comprising:
- a shunt element in electrical communication with at least one of the first tank element and the second tank element, the shunt element comprising an inductor coil that comprises a conducting wire helically turned about an axis that is perpendicular to the common axis.

20. A circuit element according to claim 17, further comprising:
- a planar circuit board upon which the first tank element and the second tank element are mounted, the circuit board disposed parallel to the common axis;
- a shunt element in electrical communication with at least one of the first tank element and the second tank element, the shunt element comprising an inductor coil that comprises a conducting wire helically turned about an axis that passes through the circuit board.

* * * * *